United States Patent [19]
Wirz

[11] Patent Number: 4,938,653
[45] Date of Patent: Jul. 3, 1990

[54] TRANSMISSION ARRANGEMENT, IN PARTICULAR A MALTESE TRANSMISSION ARRANGEMENT

[75] Inventor: Gustav Wirz, Berg, Switzerland

[73] Assignee: Alphasem AG, Berg, Switzerland

[21] Appl. No.: 263,200

[22] Filed: Oct. 27, 1988

[30] Foreign Application Priority Data

Nov. 9, 1987 [CH] Switzerland .......................... 4367/87

[51] Int. Cl.$^5$ ............................................ B66C 23/00
[52] U.S. Cl. ..................................... 414/744.2; 74/48;
74/436; 384/58; 901/19; 414/225
[58] Field of Search ...................... 74/48, 436, 104, 50;
384/19, 58; 414/225, 744.2; 901/19, 25

[56] References Cited

U.S. PATENT DOCUMENTS

| | | | |
|---|---|---|---|
| 2,598,251 | 5/1952 | Gesner | 384/58 X |
| 3,240,359 | 3/1966 | Ruesch et al. | 74/48 X |
| 3,265,450 | 8/1966 | Aho | 384/58 X |
| 3,396,856 | 8/1968 | Diepeveen | 414/744.2 |
| 3,855,873 | 12/1974 | Fletcher et al. | 74/436 |
| 3,927,573 | 12/1975 | Sheesley et al. | 74/50 |
| 4,109,539 | 8/1978 | Feleus | 74/48 X |
| 4,465,416 | 8/1984 | Burkhalter et al. | 198/468.6 X |
| 4,530,637 | 7/1985 | Mason et al. | 414/737 X |
| 4,559,838 | 12/1985 | Nevenschwander | 74/50 |
| 4,597,708 | 7/1986 | Wheeler et al. | 414/744.2 |
| 4,622,793 | 11/1986 | Oki | 74/48 X |
| 4,648,725 | 3/1987 | Takahashi | 384/58 X |
| 4,682,685 | 7/1987 | Yamada et al. | 198/468.6 X |
| 4,722,150 | 2/1988 | Jacobs et al. | 384/58 X |
| 4,808,059 | 2/1989 | Eddy | 414/225 X |

FOREIGN PATENT DOCUMENTS

| | | | |
|---|---|---|---|
| 1947915 | 5/1970 | Fed. Rep. of Germany | 74/48 |
| 0250432 | 10/1987 | Fed. Rep. of Germany | 901/19 X |

OTHER PUBLICATIONS

"United States Robotics Society" bulletin, Apr. 1978, pp. 1-4.

Primary Examiner—Robert J. Spar
Assistant Examiner—James T. Eller, Jr.
Attorney, Agent, or Firm—William R. Hinds

[57] ABSTRACT

A drive arm is guided in a play-free and low-friction manner in a guide slot in a driven arm. The guide slot has two side edges which are arranged in displaced relationship with each other. Arranged on the driven arm are two rolling members, wherein a respective rolling member is associated with each side edge. At least one of the side edges is in the form of a spring bar portion so that the two rolling members roll against their side edges under a spring biasing effect.

9 Claims, 4 Drawing Sheets

TRANSMISSION ARRANGEMENT, IN PARTICULAR A MALTESE TRANSMISSION ARRANGEMENT

FIELD OF THE INVENTION

The invention relates to a transmission mechanism arrangement, in particular a Maltese transmission mechanism or arrangement comprising at least one rotatable drive arm and at least one rotatable driven arm, wherein the drive arm has a guide element which engages into a guide slot on the driven arm.

DESCRIPTION OF THE PRIOR ART

As is known, transmission arrangements of that kind are used in engineering wherever uniform movements have to be performed cyclicaly, thus for example on automatic assembly apparatuses and the like. Thus for example single-arm Maltese transmission arrangements are also already used on automatic machining apparatuses where they impart an angular movement to the working table.

A problem which arises in relation to such transmission arrangements concerns precise guidance for the parts of the arrangement. More specifically, the guide element on the drive arm must engage into the driven arm in such a way that the frictional forces are minimized. That can be achieved by virtue of adequate clearance in the guide slot. In the case of automatic assembly apparatuses however, the driven arm must be guided with absolute precision at the latest in the final phase of the movement of the driven arm. In the case of automatic chip assembly apparatuses, deviations of just a few hundredths of a millimeter can give rise to defective positioning. The attempt has therefore already been made to incorporate clamping devices, springs and the like into the guide slot in order to guide the driven arm with as little play as possible. However that arrangement gives rise to rolling movements which are in part opposite to each other, which increases the frictional forces involved and results in abrasion wear of the material used.

SUMMARY OF THE INVENTION

Therefore an object of the present invention is to provide a transmission arrangement of the kind set forth in the opening part of this specification, in which the driven arm is guided precisely and in a play-free manner over the whole of its range of movement and in which there are no opposed rolling movements.

In accordance with the invention, that object is attained by a transmission mechanism comprising at least one drive arm rotatably mounted to turn about a first axis, at least one driven arm rotatably mounted to turn about a second axis parallel to said first axis, a first guide member mounted on said driven arm and located to define a first guide edge of a guide slot on said driven arm, a second guide member parallel to said first guide member defining a second guide edge of said guide slot, said second guide member being formed and mounted on said driven arm for said second guide edge to yield resiliently under pressure in a direction away from said first guide member, said first guide member being relatively nonyielding and nonresilient under pressure, said first and second edges being arranged in displaced relationship with each other in a direction perpendicular to the planes of rotation of said arms, and two rolling members each rotatably mounted on said drive arm and located thereon and shaped for one of said rolling members to travel along said first edge of said guide slot and for the other of said rolling members to travel along said second edge of said guide slot under resilient pressure exerted by said second guide edge when said drive arm is rotated about said first axis.

The displaced arrangement of the two side edges of the guide slot makes it possible for each side edge to have its own rolling member associated therewith. As one of the side edges is of a resilient nature, no uncontrolled play can occur in the guide slot, but only rolling friction arises. Ball bearing assemblies are preferably used for the two freely rotating rolling members. It will be appreciated that it would also be possible to envisage using simple rollers or, in certain situations of use, even ball-type guides. The two rolling members are preferably arranged coaxially so that they are disposed as closely together as possible.

A particularly precise guide action can be achieved if one edge is formed by a bar portion of a hard material, preferably carbide metal, and the other side edge is formed by a spring bar portion. The carbide metal bar portion can be precision ground and is extremely wear-resistant.

DESCRIPTION OF THE DRAWINGS

Further advantages and individual features of the invention are set forth in the following description and the drawings in which.

DESCRIPTION OF A PREFERRED EMBODIMENT

Figure 1:
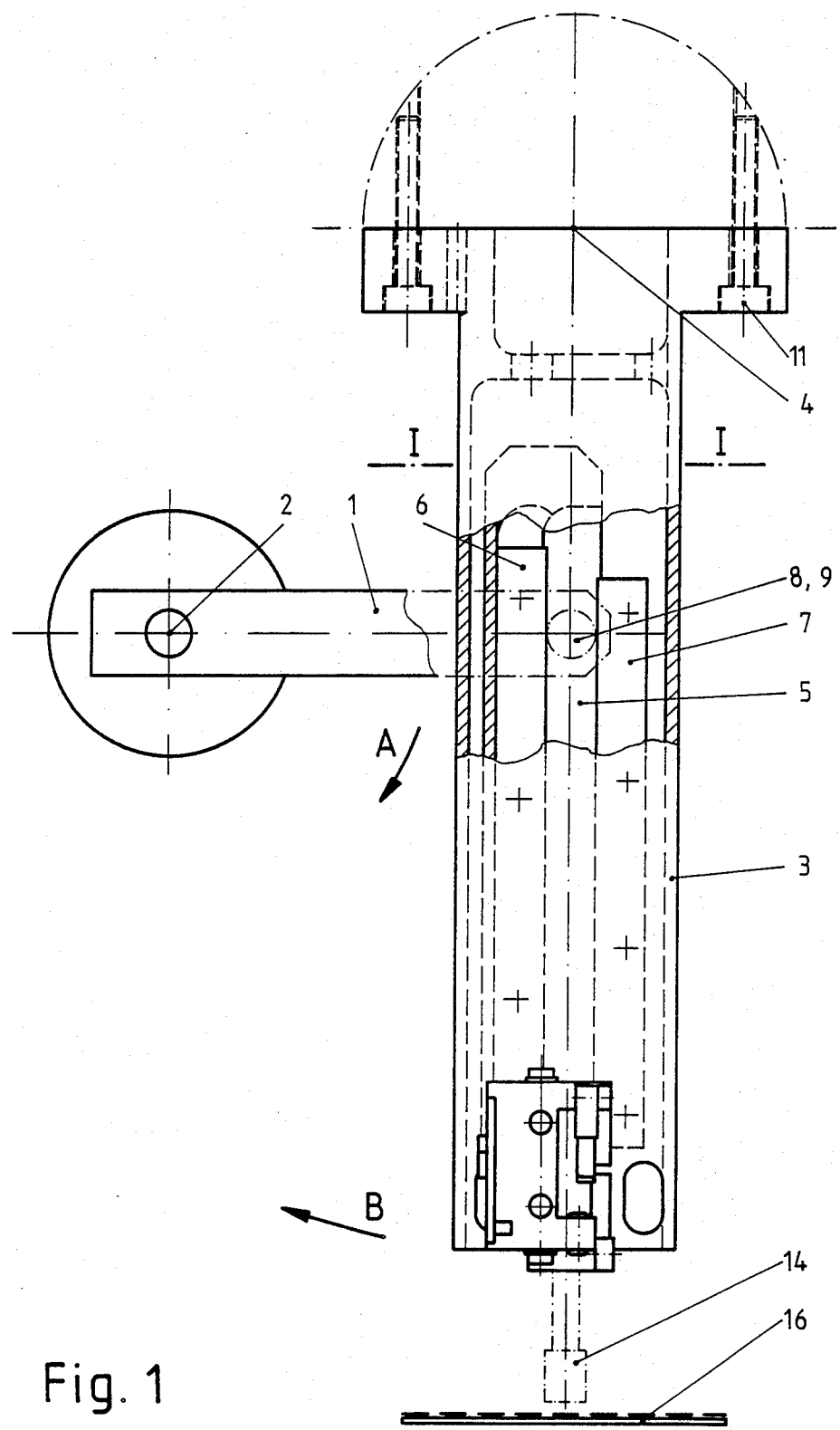
FIG. 1 is a plan view of a transmission arrangement having the features of the invention.
Figure 2:
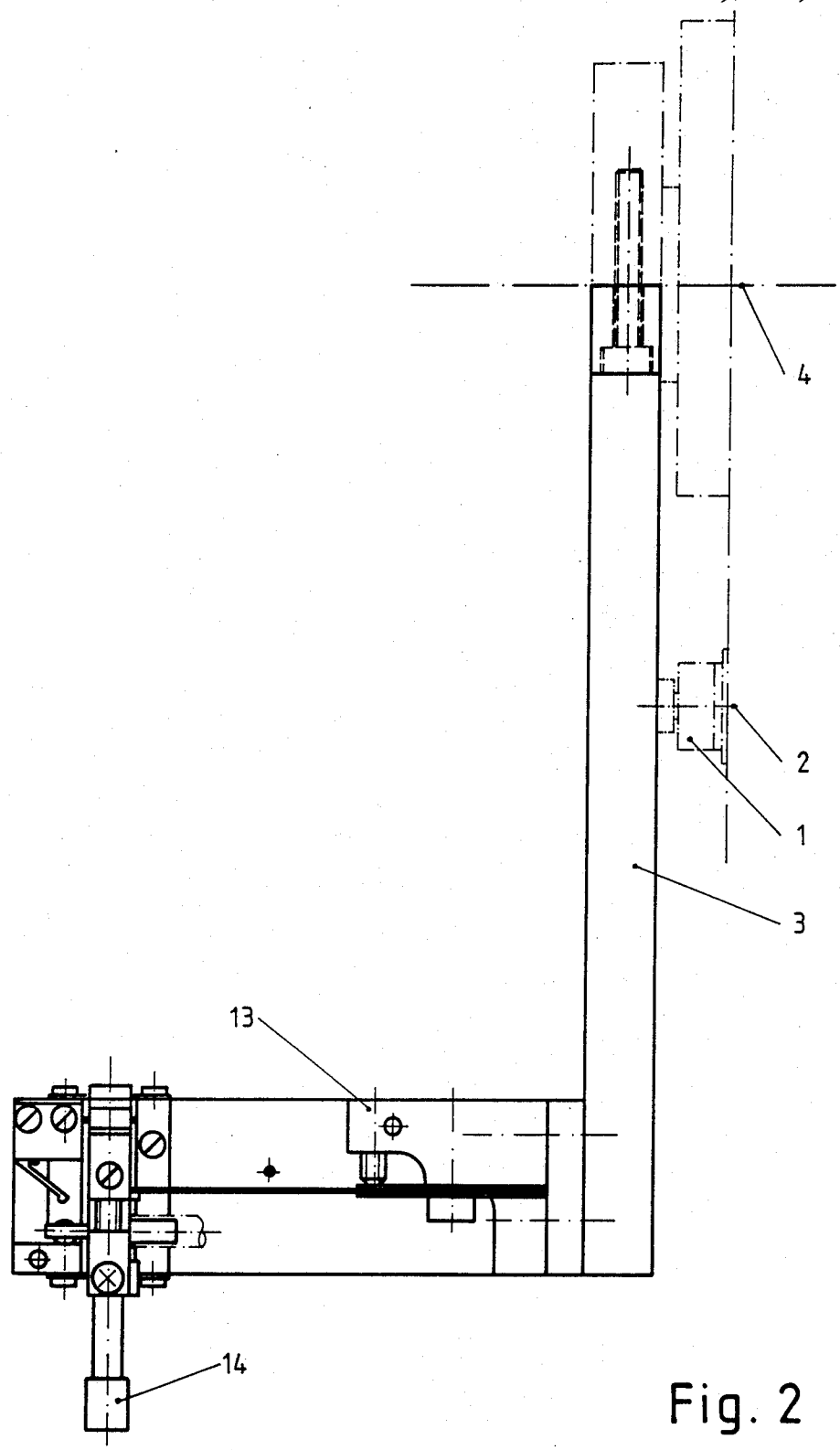
FIG. 2 is a side view of the transmission arrangement shown in FIG. 1.
Figure 3:
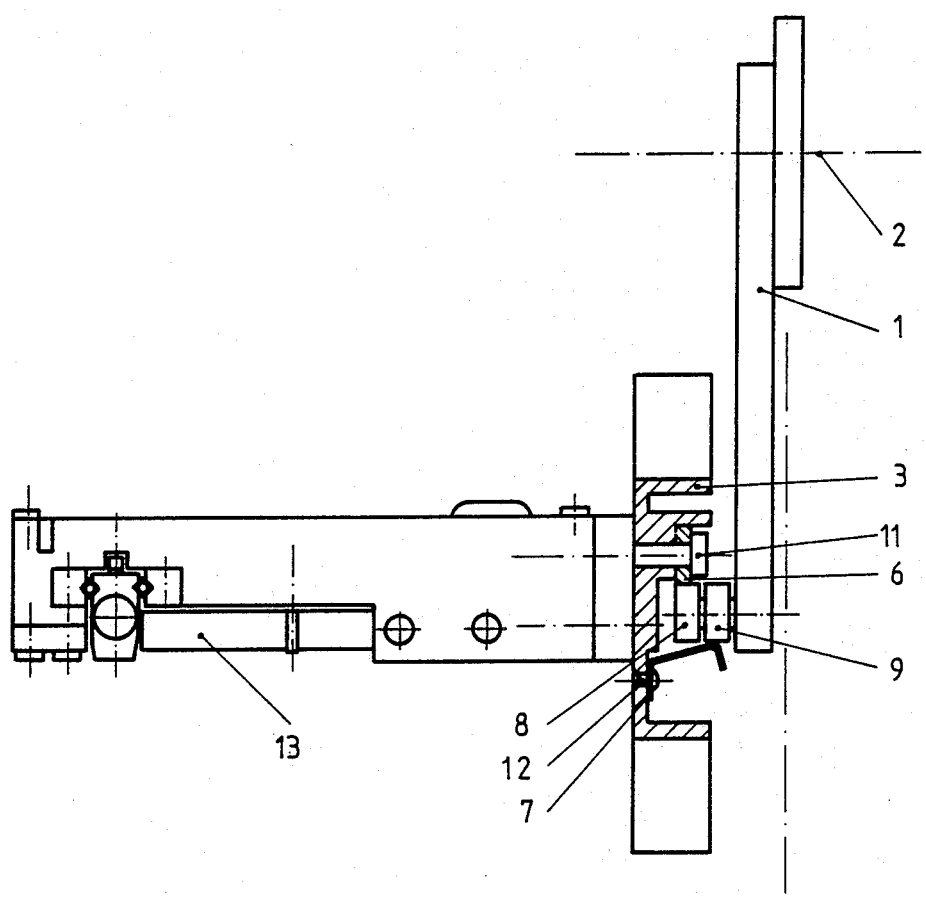
FIG. 3 is a view in section taken along line I—I in FIG. 1.

FIGS. 1 to 3 show a transmission arrangement as is used in an automatic chip assembly apparatus. The drive arm 1 is mounted for rotary movement in a play-free manner about an axis 2 which can be connected to a drive element, for example a stepping motor or a dc motor. The driven arm 3 is mounted rotatably in a play-free manner about an axis 4 and has a guide slot 5. The drive arm 1 is provided at its free end with two rolling members 8 and 9 which engage into the guide slot 5 and roll therein. When the drive arm 1 is rotated in the direction indicated by the arrow A through an angle of 270°, the driven arm 3 performs a rotary movement of 90° in the direction indicated by the arrow B. At its free end the driven arm 3 has a cantilever arm 13 to which a pick-up tool 14 (not described in greater detail herein) is fixed. Using the tool 14, chips can be picked up from a wafer 16, turned through 90° and passed to a semiconductor element. That angle can be varied as desired by varying the pivot points on the transmission arrangement relative to each other.

As can be seen in particular from FIG. 3, the guide slot has side edges which are arranged in displaced relationship with each other. The one side edge is formed by a carbide metal bar portion 6 which is releasably secured to the driven arm 3 by means of fixing screws 11. Instead of carbide metal, it would also be possible to envisage using another relatively hard sintered material, for example on a ceramic base. The oppositely disposed side edge is formed by a spring bar portion 7 which is secured to the driven arm 3 by means of rivets 12. Alternatively, the spring bar portion could also be fixed in some other fashion, thus for example by glueing, welding, soldering etc. Instead of the carbide metal bar portion, it would also be possible to use a hardened steel bar portion.

Figure 4:
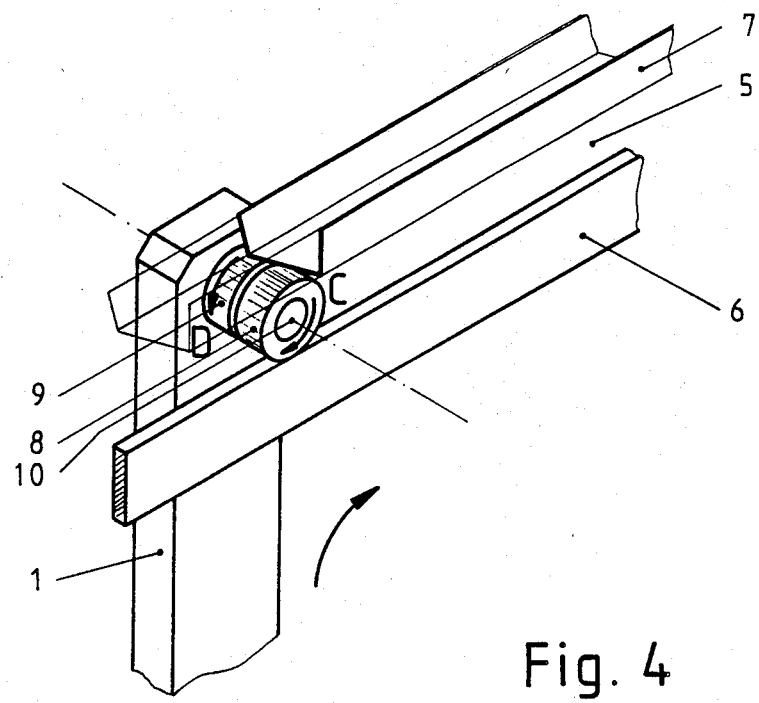
FIG. 4 is a perspective view of the two side edges with the rolling members associated therewith.

The two rolling members 8 and 9 are fixed to the drive arm 1 rotatably indpendently of each other on a common rotary spindle or shaft 10. The rolling member 8 rolls against the carbide metal bar portion 6 in the direction indicated by the arrow C and the rolling member 9 rolls against the spring bar portion 7 in the direction indicated by the arrow D as shown in FIG. 4. Preferably the carbide metal bar portion is arranged on that side of the guide slot 5 which is subjected to the greater loading upon acceleration or deceleration of the arrangement. The spring bar portion 7 presses the rolling member 8 against carbide metal bar portion 6 by way of the rolling member 9 and the common rotary shaft or spindle 10. In that arrangement, absolutely play-free operation is guaranteed, without opposed movements occurring.

Figures 5, 6:
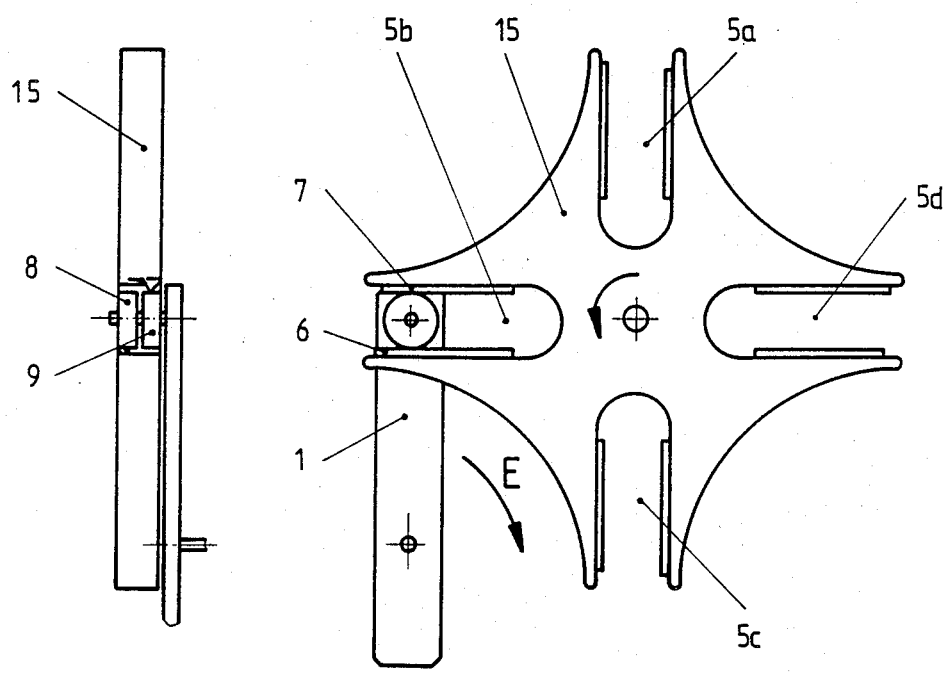
FIGS. 5 and 6 show a Maltese cross with four driven arms.

It will be appreciated that the features according to the invention may also be embodied in a transmission arrangement having a plurality of driven arms or a plurality of drive arms, in particular a Maltese cross transmission arrangement. FIGS. 5 and 6 show a Maltese cross 15 having four arms with guide slots 5a to 5d. Each guide slot is provided with a carbide metal bar portion 6 and a spring bar portion 7. The lever arm 1 rotates through 360° in the direction indicated by the arrow A and in so doing imparts a partial rotary movement through 90° in each case to the Maltese cross 15. The Maltese cross is stationary over the sector of 270° in which the rolling members 8 and 9 do not engage into a guide slot on the Maltese cross. A blocking disc may be arranged on the lever arm 1 in known fashion, the disc locking the Maltese cross until the rolling members 8 and 9 engage into a guide slot again and cause the Maltese cross to rotate. As in that embodiment the rolling members must be introduced into a guide slot for each partial rotary movement of the Maltese cross, the spring bar portion and the carbide metal bar portion could be slightly bent open at the beginning to facilitate introduction of the rolling members into the guide slot.

Alternative embodiments can be envisaged without thereby departing from the subject-matter of the invention. Thus for example instead of the spring bar portion 7 it would be possible to provide a second carbide metal or steel bar portion which is pressed against the rolling member associated therewith by a suitable spring means. It would be possible to envisage using for example a rubber spring or the like.

By virtue of its high level of precision the arrangement is particularly suitable for all kinds of automatic assembly apparatuses in the electronics industry, thus for example also for automatic SMD-machines.

I claim:

1. A transmission mechanism comprising at least one drive arm rotatably mounted to turn about a first axis, at least one driven arm rotatably mounted to turn about a second axis parallel to said first axis, a first guide member mounted on said driven arm and located to define a first guide edge of a guide slot on said driven arm, a second guide member parallel to said first guide member defining a second guide edge of said guide slot, said second guide member being formed and mounted on said driven arm for said second guide edge to yield resiliently under pressure in a direction away from said first guide member, said first guide member being relatively nonyielding and nonresilient under pressure, said first and second edges being arranged in displaced relationship with each other in a direction perpendicular to the planes of rotation of said arms, and two rolling members each rotatably mounted on said drive arm and located thereon and shaped for one of said rolling members to travel along said first edge of said guide slot and for the other of said rolling members to travel along said second edge of said guide slot under resilient pressure exerted by said second guide edge when said drive arm is rotated about said first axis.

2. A transmission mechanism according to claim 1, in which said two rolling members are coaxially mounted on said drive arm.

3. A transmission mechanism according to claim 1, in which said first guide edge is formed from a hard material and said second guide edge is formed from a resilient material shaped to provide said resilience.

4. A transmission mechanism according to claim 3, in which said hard material is a carbide metal.

5. A transmission mechanism according to claim 3, in which at least said first guide member is interchangeably mounted on said driven arm.

6. A transmission mechanism according to claim 3, in which said first guide edge of hard material is mounted on the side of said guide slot which is exposed to a greater torque when said drive arm is rotated about said first axis in a direction of a transfer operation of the mechanism.

7. An automatic assembly apparatus including a transmission mechanism according to claim 1, and a pick-up arm of an automatic assembly apparatus mounted in an operative position on said driven arm.

8. A transmission mechanism according to claim 1, in which said driven arm constitutes one of four similar arms rigidly fixed together in a Maltese cross configuration and located to be rotated in steps about said second axis when said drive arm is rotated about said first axis.

9. An automatic chip assembly apparatus including a transmission mechanism according to claim 1, and a pick-up arm operatively mounted on said driven arm for picking up chips from a wafer.

* * * * *